(12) United States Patent
Hembree et al.

(10) Patent No.: US 6,798,224 B1
(45) Date of Patent: Sep. 28, 2004

(54) METHOD FOR TESTING SEMICONDUCTOR WAFERS

(75) Inventors: David R. Hembree, Boise, ID (US); Warren M. Farnworth, Nampa, ID (US); Salman Akram, Boise, ID (US); Alan G. Wood, Boise, ID (US); C. Patrick Doherty, Boise, ID (US); Andrew J. Krivy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 10/072,734

(22) Filed: Feb. 5, 2002

Related U.S. Application Data

(62) Division of application No. 09/929,388, filed on Aug. 14, 2001, now Pat. No. 6,359,456, which is a division of application No. 09/303,367, filed on Apr. 30, 1999, now Pat. No. 6,275,052, which is a division of application No. 08/797,719, filed on Feb. 11, 1997, now Pat. No. 6,060,891.

(51) Int. Cl.[7] ............... G01R 1/073; G01R 31/28
(52) U.S. Cl. ............... 324/754; 324/757; 324/765
(58) Field of Search ............... 324/754, 755, 324/575, 578, 761, 765; 439/66, 67, 68, 71, 73

(56) References Cited

U.S. PATENT DOCUMENTS

| | | | |
|---|---|---|---|
| 3,866,119 A | | 2/1975 | Ardezzone et al. |
| 4,597,617 A | | 7/1986 | Enochs |
| 4,795,977 A | * | 1/1989 | Frost et al. |
| 4,891,585 A | * | 1/1990 | Janko et al. |
| 4,906,920 A | * | 3/1990 | Huff et al. |
| 4,918,383 A | * | 4/1990 | Huff et al. |
| 4,952,272 A | | 8/1990 | Okino et al. |
| 5,020,219 A | * | 6/1991 | Leedy |
| 5,034,685 A | * | 7/1991 | Leedy |
| 5,049,813 A | * | 9/1991 | Van Loan et al. |

(List continued on next page.)

FOREIGN PATENT DOCUMENTS

| | | |
|---|---|---|
| GB | 2 293 268 | 3/1996 |
| JP | 3-69131 | 3/1991 |
| JP | 7-159485 | 6/1995 |
| JP | 8-50146 | 2/1996 |
| JP | 8-5666 | 12/1996 |

OTHER PUBLICATIONS

"COBRA™ technology makes Wentworth Labs the world's most advanced probe card manufacturer." Wentworth Laboratories advertising brochure, (month unavailable), 1996.

(List continued on next page.)

*Primary Examiner*—Ernest Karlsen
(74) *Attorney, Agent, or Firm*—Stephen A. Gratton

(57) ABSTRACT

A probe card for testing semiconductor wafers, and a method and system for testing wafers using the probe card are provided. The probe card is configured for use with a conventional testing apparatus, such as a wafer probe handler, in electrical communication with test circuitry. The probe card includes an interconnect substrate having contact members for establishing electrical communication with contact locations on the wafer. The probe card also includes a membrane for physically and electrically connecting the interconnect substrate to the testing apparatus, and a compressible member for cushioning the pressure exerted on the interconnect substrate by the testing apparatus. The interconnect substrate can be formed of silicon with raised contact members having penetrating projections. Alternately the contact members can be formed as indentations for testing bumped wafers. The membrane can be similar to multi layered TAB tape including metal foil conductors attached to a flexible, electrically-insulating, elastomeric tape. The probe card can be configured to contact all of the dice on the wafer at the same time, so that test signals can be electronically applied to selected dice as required.

12 Claims, 6 Drawing Sheets

U.S. PATENT DOCUMENTS

| | | | |
|---|---|---|---|
| 5,070,297 A | | 12/1991 | Kwon et al. |
| 5,123,850 A | | 6/1992 | Elder et al. |
| 5,124,639 A | * | 6/1992 | Carlin et al. |
| 5,166,602 A | | 11/1992 | Byford et al. |
| 5,172,050 A | * | 12/1992 | Swapp |
| 5,177,439 A | * | 1/1993 | Liu et al. |
| 5,180,977 A | * | 1/1993 | Huff |
| 5,264,787 A | * | 11/1993 | Woith et al. |
| 5,326,428 A | * | 7/1994 | Farnworth et al. |
| 5,329,226 A | | 7/1994 | Monnet et al. |
| 5,408,190 A | * | 4/1995 | Wood et al. |
| 5,412,329 A | | 5/1995 | Iino et al. |
| 5,419,807 A | * | 5/1995 | Akram et al. |
| 5,451,489 A | | 9/1995 | Leedy |
| 5,461,326 A | * | 10/1995 | Woith et al. ............. 324/758 |
| 5,483,741 A | | 1/1996 | Akram et al. |
| 5,495,667 A | * | 3/1996 | Farnworth et al. |
| 5,517,126 A | * | 5/1996 | Yamaguchi |
| 5,521,522 A | | 5/1996 | Abe et al. |
| 5,578,526 A | * | 11/1996 | Akram et al. |
| 5,606,263 A | * | 2/1997 | Yoshizawa et al. |
| 5,607,818 A | | 3/1997 | Akram et al. |
| 5,686,317 A | | 11/1997 | Akram et al. |
| 5,701,666 A | | 12/1997 | DeHaven et al. |
| 5,703,494 A | | 12/1997 | Sano |
| 5,716,218 A | | 2/1998 | Farnworth et al. |
| 5,825,192 A | | 10/1998 | Hagihara |
| 5,869,974 A | | 2/1999 | Akram et al. |
| 5,894,161 A | | 4/1999 | Akram et al. |
| 5,952,843 A | | 9/1999 | Vinh |
| 6,005,401 A | | 12/1999 | Nakata et al. |
| 6,060,891 A | | 5/2000 | Hembree et al. |
| 6,068,669 A | | 5/2000 | Farnworth et al. |
| 6,072,321 A | | 6/2000 | Akram et al. |
| 6,275,052 B1 | | 8/2001 | Hembree et al. |
| 6,356,098 B1 | | 3/2002 | Akram et al. |
| 6,359,456 B1 | | 3/2002 | Hembree et al. |
| 6,469,537 B1 | | 10/2002 | Akram et al. |

OTHER PUBLICATIONS

"Science Over Art. Our new IC Membrane Test Probe", Packard Hughes Interconnect, advertising brochure, (month unavailable) 1993.

* cited by examiner

METHOD FOR TESTING SEMICONDUCTOR WAFERS

CROSS REFERENCE TO RELATED APPLICATIONS

This application is a division of Ser. No. 09/929,388, filed Aug. 14, 2001, U.S. Pat. No. 6,359,456 B1, which is a division of Ser. No. 09/303,367 filed Apr. 30, 1999, U.S. Pat. No. 6,275,052, which is a division of Ser. No. 08/797,719 filed Feb. 11, 1997, U.S. Pat. No. 6,060,891.

FIELD OF THE INVENTION

This invention relates generally to semiconductor manufacture and specifically to a probe card for establishing temporary electrical communication with a substrate, such as a semiconductor wafer. This invention also relates to a method for fabricating the probe card, to a method for testing substrates using the probe card, and to a system for testing substrates that includes the probe card.

BACKGROUND OF THE INVENTION

During a semiconductor fabrication process semiconductor dice are formed on a wafer. The wafer includes a semiconducting substrate, such as silicon or gallium arsenide, on which integrated circuits are formed. During and following the fabrication process, the wafer must be tested to evaluate the electrical characteristics of the integrated circuits. For example, standard wafer probe is performed to test the gross functionality of each die contained on the wafer. Speed probe is performed to test the speed performance of the dice. Other tests such as full functionality testing, burn-in testing and dynamic burn-in testing are typically performed after the dice have been singulated from the wafer.

Currently semiconductor wafers are probe tested utilizing probe cards. One type of probe card includes needle probes for making temporary electrical connections between contact locations on the dice (e.g., bond pads, fuse pads, test pads) and external test circuitry. The probe card typically includes an insulating substrate, such as a glass filled plastic. The substrate can include electrical traces in electrical communication with the needle probes. In addition, the needle probes can be configured to contact a specific die on the wafer. Typically the wafer or the probe card is stepped so that the dice on the wafer are tested one at a time in sequence. There are also probe cards configured to test multiple dice on the wafer (e.g., 8 to 16).

One problem with this type of conventional probe card is that the planarity and positions of the needle probes can vary. Typically the needle probes must initially be bent by hand into required x and y locations to match the contact locations on the wafer. This is a very labor intensive procedure. Also the z-direction location of the contact locations on the wafer can vary. This can cause inaccuracies in the test results because electrical contact with the different contact locations can vary. Continued use of the needle probes causes deformation and further misalignment of the needle probes. Probe cards with needle probes are thus expensive to fabricate and expensive to maintain.

Another problem with needle probe cards is that the contact locations on the wafer are typically coated with a metal oxide layer. For example, aluminum test pads can be covered with aluminum oxide that forms by oxidation of the underlying metal. This metal oxide is electrically non-conductive and provides a high degree of electrical resistance to the needle probes. In order to ensure accurate test results, the needle probes must penetrate this oxide layer to the underlying metal film. This requires "overdrive" and "scrub" forces which can damage the contact locations and wafer.

Typically, to penetrate the oxide, the probe card and wafer are brought together until the needle probes contact the contact location. The probe card is then "overdriven" a distance (e.g., 3 mils) which deflects the needle probes and causes them to bend. As the needle probes bend, the ends of the needle probes-move horizontally across the contact location causing the ends to scrape over the metal. This causes the ends to break through the native oxide layer and contact the underlying metal. The scrubbing action also displaces some of the metal on the contact location causing a groove and a corresponding ridge.

Still another problem with needle probe cards is that they require the contact locations on the dice to be oversized. In particular due to the inaccuracies in the x-y placement of the needle probes, the contact locations on the dice must made large enough to accommodate alignment variations between the needle probes. This requires that the contact locations be made larger by default, which in turn makes the dice larger.

To overcome some of the problems associated with conventional needle probes, membrane probe cards have been developed. Membrane probe cards are manufactured by Packard Hughes Interconnect of Los Angeles, Calif., and others. Membrane probe cards typically include a membrane formed of a thin and flexible dielectric material such as polyimide. Contact bumps are formed on the membrane in electrical communication with conductive traces, typically formed of copper. The conductive traces electrically connect to external test circuitry.

In general, membrane probes are able to compensate for vertical misalignment between the contact locations on the wafer. In addition, the membrane probe can include a force applying mechanism that allows the contact bumps to penetrate the oxide layer of the die contact locations. Membrane probes usually don't have the "scrubbing" action of needle probes. Rather membrane probes rely on penetration contact bumps to break through the oxide and contact the underlying metal.

One disadvantage of membrane probes is that vertical "overdrive" forces are required to penetrate the oxide and make a reliable electrical connection between the contact bumps on the probe and the contact locations on the wafer. These forces can damage the contact locations and the wafer. In addition, the contact bumps and membranes can be repeatedly stressed by the forces. These forces can also cause the membrane to lose its resiliency.

Another disadvantage of membrane probe card is the CTE (coefficient of thermal expansion) mismatch between the probe card and wafer. In particular the copper traces on the probe card will move as a result of temperature fluctuations causing the contact bumps to scrub across the contact locations. This can damage the contact locations or an associated passivation layer. In addition, the masks required to make the membranes are difficult to make with high volume processes. This makes membrane probe cards very expensive.

Yet another disadvantage of probe cards is that dynamic burn-in and full functionality testing are typically performed at the die level rather than at the wafer level. One reason that these test procedures are not performed at the wafer level is that these tests require a large number of connections with the wafer. In addition, a large number of input/output paths between the wafer and test circuitry are required. For example, a wafer can include several hundred dice each having twenty or more bond pads. The total number of bond pads on the wafer can be in the thousands. For some tests procedures an input/output path must be provided to each bond pad. Even with wafer stepping techniques, conventionally formed probe cards, usually do not include enough probes or contact bumps to test groups of dice having a large number of contact locations.

In view of the deficiencies of prior art probe cards, improved probe cards are needed for semiconductor manufacture.

SUMMARY OF THE INVENTION

In accordance with the present invention, an improved probe card for testing substrates such as semiconductor wafers, a method for fabricating the probe card, a method for testing using the probe card, and a system for testing that includes the probe card are provided.

The probe card includes an interconnect substrate having patterns of contact members for electrically contacting corresponding patterns of contact locations (e.g., bond pads, fuse pads, test pads) on one or more dice on a wafer under test. The probe card also includes a membrane for physically and electrically connecting the interconnect substrate to a testing apparatus (e.g., wafer probe handler). Preferably the membrane comprises a thin elastomeric tape having metal conductors formed thereon. The membrane can be similar to multi layered TAB tape comprising an elastomeric tape, such as polyimide, laminated with patterns of metal foil conductors.

The probe card can also include a compressible member mounted to a surface (e.g., backside) of the interconnect substrate. The compressible member cushions the forces applied by the testing apparatus to the wafers, and allows the interconnect substrate to self planarize to the contact locations on the wafers. The compressible member can be formed of an elastomeric material, as a gas filled bladder, or as a sealed space for retaining compressed air. The compressible member can also be formed of a metal elastomer to provide heat conduction from the interconnect substrate and wafer.

In an illustrative embodiment of the probe card, the contact members comprise raised members having penetrating projections covered with conductive layers. The penetrating projections can be configured to penetrate the contact locations on the wafer to a self limiting penetration depth. The conductive layers can include a barrier layer, or can be formed of a non-reactive material, to prevent material transfer between the contact members and contact locations during a test procedure. In addition, the contact members can be formed in dense patterns to accommodate testing of dense arrays of dice having dense patterns of contact locations. Furthermore, the contact members can be sized and shaped to minimally damage the contact locations on the wafer yet provide a reliable electrical connection.

Still another aspect of the contact members is that less contact force is required so that multiple dice, up to all of the dice on a semiconductor wafer, can be contacted at the same time. With all of the dice on the wafer contacted at the same time, test signals can be electronically applied and switched as required, to selected dice on the wafer.

In addition to the contact members, the interconnect substrate includes patterns of conductors formed in electrical communication with the conductive layers for the contact members. The patterns of conductors can be configured to establish electrical communication with corresponding patterns of conductive traces on the membrane. The patterns of conductors can also include bonding pads formed on a stepped edge, or grooved portion of the interconnect substrate. The stepped edge or grooved portion provides a recess for bonding of the membrane to the interconnect substrate without interfering with the operation of the contact members. Bonding between the conductors and membrane can be effected by wire bonding, ribbon bonding, microbump bonding or conductive adhesives.

An alternate embodiment probe card includes indentation contact members, configured to establish electrical communication with bumped contact locations (e.g., solder bumps) on a bumped wafer. Another alternate embodiment probe card includes compliant contact members comprising contact pins formed with a spring segment. Another alternate embodiment probe card includes a rigid mounting plate to which the interconnect substrate can be bonded. The mounting plate can also include terminal contacts arranged in a dense array (e.g., pin grid array) for electrically mounting the interconnect substrate to a corresponding socket on the testing apparatus.

The probe card can also include a leveling mechanism for planarizing a location of the contact members with respect to the contact locations on the wafer. The leveling mechanism can include leveling screws that are adjustable to change the planar orientation of the interconnect substrate.

A method for testing a semiconductor wafer in accordance with the invention comprises the steps of: providing a testing apparatus comprising test circuitry and a probe card fixture; providing an interconnect substrate comprising contact members configured to establish temporary electrical communication with contact locations on the wafer, connecting a membrane to the interconnect substrate configured to physically mount the interconnect substrate to the probe card fixture and to provide an electrical path between the contact members and test circuitry; biasing the interconnect substrate against the wafer to form an electrical connection therebetween; and then applying test signals through the membrane and contact members to contact locations on the wafer.

A system for testing a semiconductor wafer in accordance with the invention comprises: a testing apparatus including test circuitry and a probe card fixture; an interconnect substrate flexibly mounted to the probe card fixture, configured to establish temporary electrical communication with contact locations on the wafer; and a membrane for mounting the interconnect substrate to the probe card fixture, and for establishing an electrical connection between the contact members and the test circuitry.

DETAILED DESCRIPTION OF THE PREFERRED EMBODIMENTS

Figure 1:
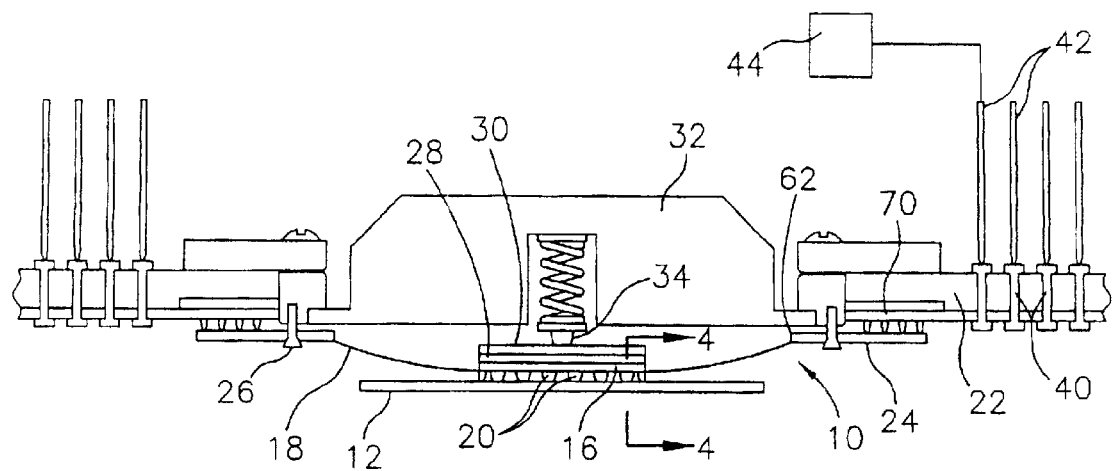
FIG. 1 is a schematic cross sectional view of a probe card constructed in accordance with the invention, mounted to a probe card fixture and illustrated during testing of a semiconductor wafer.
Figure 2:
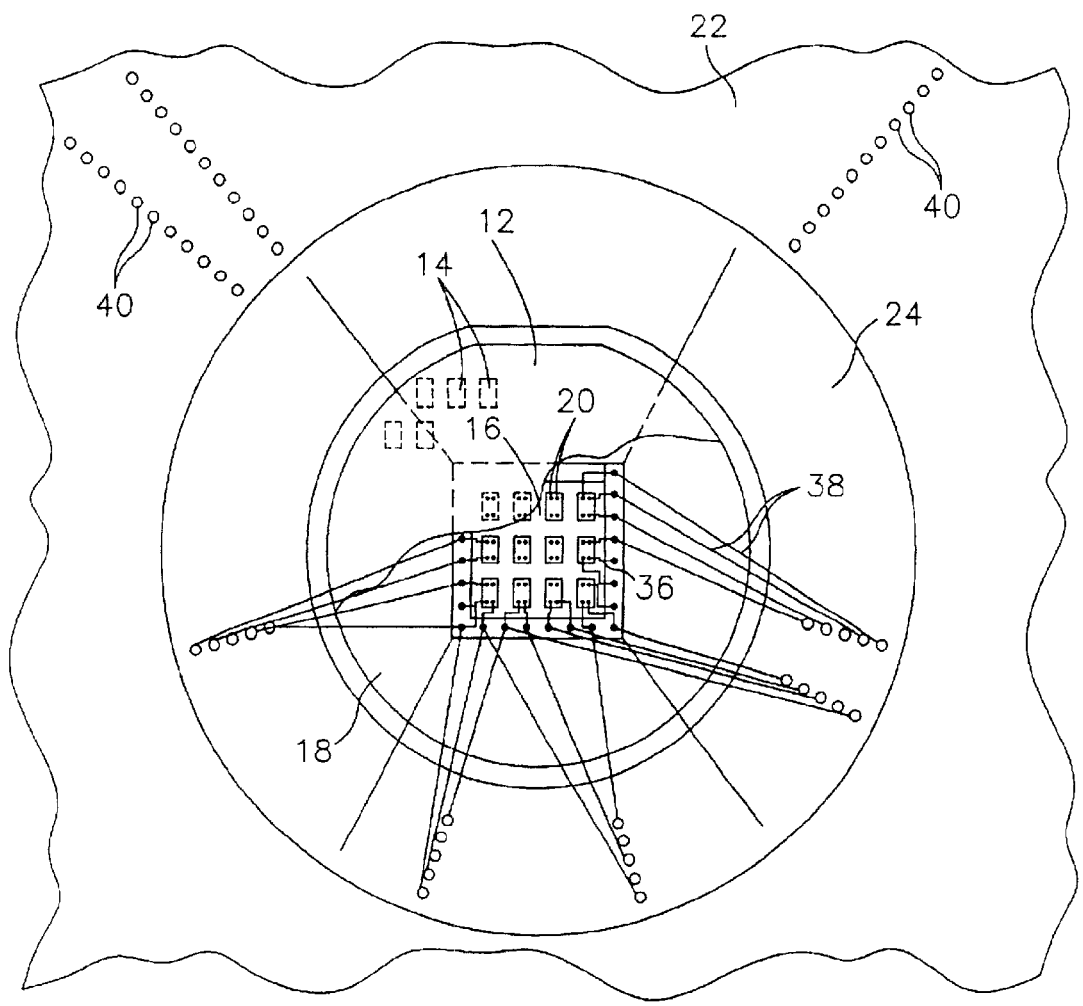
FIG. 2 is a bottom view, with the wafer partially cut away, of the probe card shown in FIG. 1.
Figure 4:
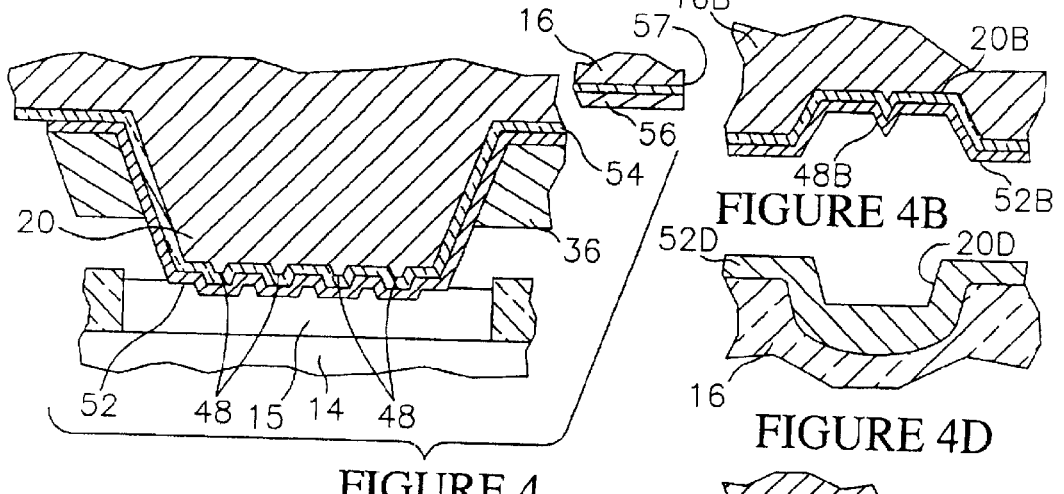
FIG. 4 is an enlarged schematic cross sectional view taken along section line 4—4 of FIG. 1, illustrating a contact member for the interconnect in temporary electrical communication with a contact location on the semiconductor wafer.

Referring to FIGS. 1 and 2, a probe card 10 constructed in accordance with the invention is shown during testing of a semiconductor wafer 12. The wafer 12 includes a plurality of semiconductor dice 14 (FIG. 2) each having a plurality of contact locations 15 (FIG. 4). The contact locations 15 are in electrical communication with the integrated circuits and semiconductor devices formed on the dice 14 and provide electrical access for testing.

In FIG. 1, the wafer 12 is supported circuit side up for contact with the probe card 10. The wafer 12 can be an entire semiconductor wafer 12 or portion of a wafer or other semiconducting substrate. A conventional testing apparatus such as a wafer probe handler (not shown) can be used to support and bias the probe card 10 and wafer 12 together during the testing procedure. The wafer probe handler can include a chuck (not shown) for supporting the wafer 12. Suitable wafer probe handlers are manufactured by Electroglass and others.

The probe card 10, comprises an interconnect substrate 16 and a membrane 18. The interconnect substrate 16 includes patterns of contact members 20 configured to electrically contact the contact locations 15 (FIG. 4) on the semiconductor dice 14. The membrane 18 physically and electrically attaches the interconnect substrate 16 to a probe card fixture 22 mounted to the testing apparatus.

A membrane mounting plate 24 secures the membrane 18 to the probe card fixture 22. The membrane mounting plate 24 can be a rigid annular member that can be attached to the probe card fixture 22 using threaded fasteners 26 or other fastening mechanism. The membrane 18 can be attached to the membrane mounting plate 24 using an adhesive (not shown) or threaded fasteners (not shown).

It is to be understood that the membrane mounting plate 24 and probe card fixture 22 can be components of the wafer probe handler and are merely illustrative. In addition, a force applying mechanism 32 and spring loaded force applying member 34 can be associated with the probe card fixture 22. Alternately, the interconnect substrate 16 and membrane 18 can be mounted to other types of probe card fixtures. For example one type of other suitable probe card fixture (not shown) includes a nest wherein the interconnect substrate 16 can be mounted.

Still referring to FIG. 1, the probe card 10 can also include a compressible member 28 in contact with a surface (e.g., backside) of the interconnect substrate 16, and a pressure plate 30 in contact with the compressible member 28. The compressible member 28 and pressure plate 30 are configured to transfer pressure exerted by the force applying member 34 of the testing apparatus (e.g., wafer probe handler) to the interconnect substrate 16. This provides a contact force for forming the electrical connection between the contact members 20 and contact locations 15 (FIG. 4). However, because the contact members 20 require less force application to penetrate the contact locations 15 (FIG. 4) than a conventional contact bump, the force applying member 34 can be operated with less force. In addition, because less force is required, the interconnect substrate 16 can be configured to test large groups of dice at the same time (e.g., 16, 32, 64, 128 etc.) up to all of the dice 14 on the wafer 12. The pressure plate 30 can be formed of metal or another rigid material in order to distribute the pressure across the full surface of the compressible member 28.

The compressible member 28 can be formed of an elastomeric material to provide a cushioning effect. A metal filled elastomeric material can be used to provide heat conduction for cooling. In addition the compressible member 28 allows the contact members 20 to self planarize to the z-direction location of the contact locations 15 (FIG. 4) on the wafer 12. By way of example, the compressible member 28 can be formed of an elastomeric material such as silicone, butyl rubber, or fluorosilicone; in foam, gel, solid or molded configurations. Suitable elastomeric materials include "PORON" available from Rogers or "BISCO" available from a Dow Chemical subsidiary. The compressible member 28 and pressure plate 30 can have peripheral outlines that correspond to a peripheral outline of the interconnect substrate 16. A representative thickness for the compressible member 28 can be from 0.5 mm to 4 mm. If desired, the compressible member 28 can be secured to the interconnect substrate 16 and pressure plate 30 using an adhesive such as silicone. One suitable adhesive is "ZYMET" silicone elastomer manufactured by Zymet, Inc., East Hanover, N.J.

Rather than being formed of elastomeric materials, the compressible member 28 can be formed as a compressible gas filled bladder. This type of bladder is available from Paratech of Frankfort, Ill. under the trademark "MAXI FORCE AIR BAG". The compressible member 28 can also be formed as a heat conductive material such as a metal filled elastomer to conduct heat from the wafer.

As shown in FIG. 2, each contact member 20 on the interconnect substrate 16 can be in electrical communication with a conductor 36 formed on the interconnect substrate 16. As will be further explained, the conductors 36 on the interconnect substrate 16 can be physically and electrically bonded to corresponding conductors 38 formed on the membrane 18. The conductors 38 on the membrane 18 can be in electrical communication with contact plugs 40 (FIG. 1) formed on the probe card fixture 22. The contact plugs 40 on the probe card fixture 22 can be adapted for electrical contact by pogo pins 42 (FIG. 1) or other electrical connectors in electrical communication with test circuitry 44 (FIG. 1).

Figure 3:
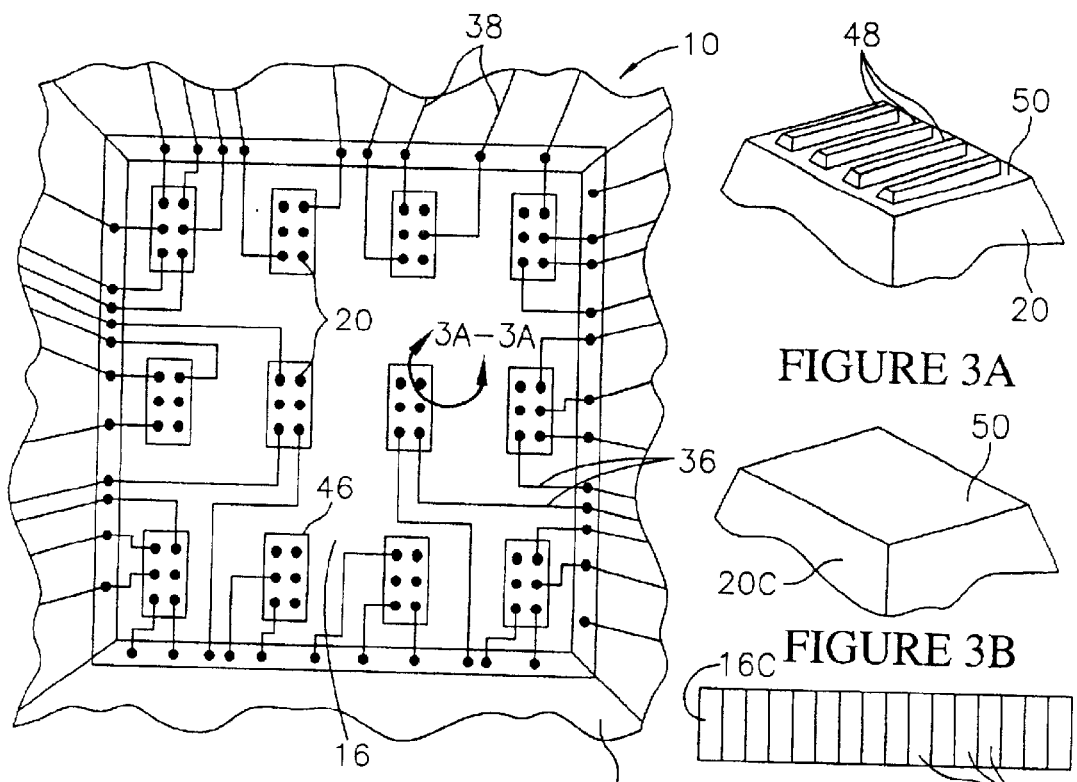
FIG. 3 is an enlarged portion of FIG. 2 illustrating an interconnect substrate with patterns of contact members thereon, and a membrane for mounting the interconnect substrate to the probe card fixture.

Referring to FIG. 3, further details of the interconnect substrate 16 and contact members 20 are illustrated. The contact members 20 on the interconnect substrate 16 are formed in patterns 46 that match the patterns of the contact locations 15 (FIG. 4) on the semiconductor dice 14 (FIG. 2). In the illustrative embodiment there are twelve patterns 46 of contact members 20 arranged in three rows and four columns. This permits the interconnect substrate 16 to contact and test twelve semiconductor dice 12 (FIG. 2) on the wafer 12 at the same time. The wafer probe handler can be used to step the wafer 12, or the interconnect substrate 16, so that the remaining dice 14 can be tested in groups of twelve (or less) until all of the dice 14 on the wafer 12 have been tested.

Figure 3A:
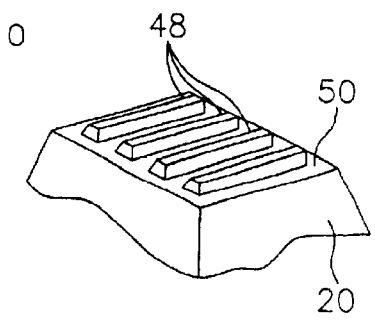
FIG. 3A is an enlarged perspective view taken along section line 3A—3A of FIG. 3, illustrating a single contact member with penetrating projections on the interconnect substrate.
Figure 3B:
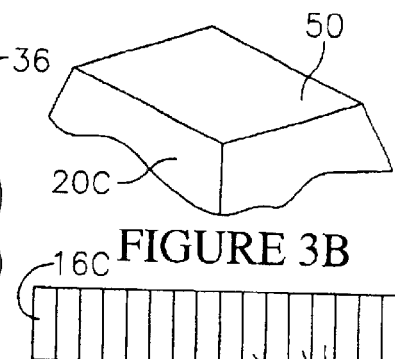
FIG. 3B is an enlarged perspective view equivalent to FIG. 3A but illustrating an alternate embodiment contact member formed without penetrating projections.
Figure 3C:
FIG. 3C is a schematic plan view of an alternate embodiment interconnect substrate having sixteen patterns of contact members arranged in a single row.

FIG. 3C illustrates an alternate embodiment interconnect substrate 16C having sixteen patterns 46 of contact members 20. In this case the patterns 46 are formed in a single row.

Other patterns 46 of contact members 20 are also possible. In general, in order to test multiple dice 14 at the same time certain conditions must be met. Firstly, the patterns 46 of contact members 20 (FIG. 3) on the interconnect substrate 16 must exactly match the patterns of contact locations 15 on the dice 14. In addition, the stepping distance (i.e., x-y repeat and pattern spacing) must be the same for the contact members 20 as for the contact locations 15. Secondly, the software that controls the stepping process must be able to pick valid test sites. For example, when testing at the edges of a round wafer with a probe card that includes rectangular or square patterns of contact members 46, some patterns of contact members 46 will not have an associated die under test. It is also desirable to not have contact members 46 contacting the passivation layer on the dice 14 as this can damage the contact members 20.

Alternately, the interconnect substrate 16 can be formed with enough patterns 46 of contact members 20 to simultaneously contact every contact location 15 for all of the dice 14 on the wafer 12. Test signals can then be selectively applied and electronically switched as required, to selected dice 14 on the wafer 12. In general, the interconnect substrate 16 can be formed with any desired number of patterns 46 of contact members 20. In addition, the interconnect substrate 16 can be configured to test a complete semiconductor wafer 12 or to test a partial wafer or other substrate that has been segmented into arrays of dice 14.

As shown in FIG. 3A, the contact members 20 can be formed as raised members that project from a surface of the interconnect substrate 16. The raised contact members 20 help to provide a separation distance between the interconnect substrate 16 and the wafer 12 to clear any particulate contaminants that may be present on the opposing surfaces. In addition, the contact members 20 can include penetrating projections 48 adapted to penetrate the contact locations 15 (FIG. 4) on the wafer 12 to a limited penetration depth. In particular, the penetrating projections 48 have a height that is less than a thickness of the contact locations 15 (FIG. 4). For thin film aluminum contact locations 15 (FIG. 4) this thickness will typically be less than 2.0 $\mu$m. As also shown in FIG. 3A, an upper surface 50 of the contact member 20 provides a stop plane for limiting penetration of the contact members 20 into the contact locations 15 (FIG. 4). This stop plane along with the dimensions of the penetrating projections 48 insures that the contact members 20 minimally damage the bond pads 16 during a test procedure.

As shown in FIG. 3B, an alternate embodiment contact member 20C can be formed without penetrating projections. In this case surfaces 50C of the contact members 20C contact but do not penetrate into the contact locations 15 (FIG. 4).

As will be further explained, the contact members 20 and penetrating projections 48 can be formed integrally on the interconnect substrate 16 using a semiconductor fabrication process such as bulk micromachining. Such a process permits the contact members 20 and penetrating projections 48 to be formed accurately in a dense array. In addition, the interconnect substrate 16 can be formed of silicon such that the CTE of the interconnect substrate 16 and wafer 12 can be the same.

Referring to FIG. 4, further details of the interconnect substrate 16 and contact members 20 are illustrated. Each contact member 20 includes a conductive layer 52 formed thereon. In addition, the interconnect substrate 16 includes an insulating layer 54 formed over its entire surface. The insulating layer 54 electrically insulates the conductive layers 52 for the contact members 20 and the conductors 36 from the interconnect substrate 16. As will be further explained, with the interconnect substrate 16 formed of silicon, the insulating layer 54 can be a grown or deposited oxide such as $SiO_2$. The interconnect substrate 16 can also be formed of doped silicon such that the bulk substrate functions as a ground plane (Vss). Such a ground plane can provide lower capacitance and impedance matching for high speed testing with less noise.

The conductive layers 52 for all of the contact members 20 can be formed of a metal layer deposited and patterned to cover the contact members 20, or other selected areas of the interconnect substrate 18. By way of example, the conductive layers 52 for the contact members 20 can be formed of aluminum, copper, titanium, tungsten, tantalum, platinum, molybdenum, cobalt, nickel, gold, iridium or alloys of these metals. Some of these materials such as gold and platinum are non-reactive so that material transfer between the contact members 20 and contact locations 15 can be minimized.

The conductive layers 52 can also be a metal silicide or a conductive material such as polysilicon. In addition, the conductive layers 52 can be formed as a bi-metal stack comprising a base layer and a non-reactive and oxidation resistant outer layer such as gold or platinum.

The conductive layers 52 can be formed using a metallization process comprising deposition (e.g., CVD), followed by photo patterning and etching. The conductive layer 52 for each contact member 20 is in electrical communication with a corresponding conductor 36 formed on the interconnect substrate 18. The conductive layers 52 and conductors 36 can be formed at the same time using the same metallization process. Alternately, the conductive layers 52 can be formed of a different metal than the conductors 36 using separate metallization process.

The conductors 36 can include bonding pads 56 formed at a terminal end thereof such as along a peripheral edge 57 of the interconnect substrate 16. As will be further explained, the peripheral edge 57 can include a step (or groove) for recessing the bonding pads 56 to provide clearance for bonding to the membrane 18. The bonding pads 56 can be formed of a same metal as the conductors. 36 or can be one or more different layers having a metallurgy suitable for soldering or otherwise forming an electrical interconnection to the conductors 38 on the membrane 18. Further details of the electrical interconnection between the interconnect substrate 16 and the membrane 18 will become more apparent as the description proceeds.

Figure 4B:
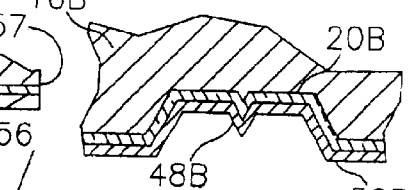
FIG. 4B is an enlarged cross sectional view equivalent to FIG. 4A, illustrating the alternate embodiment contact member for bumped wafers having a penetrating projection.
Figure 4D:
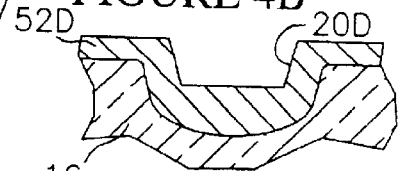
FIG. 4D is an enlarged cross sectional view equivalent to FIG. 4, illustrating another alternate embodiment compliant contact member formed on an interconnect substrate.
Figure 4A:
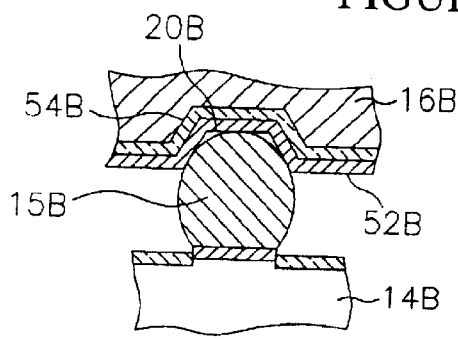
FIG. 4A is an enlarged cross sectional view equivalent to FIG. 4, illustrating an alternate embodiment contact member adapted to test a "bumped" semiconductor wafer.

Referring to FIG. 4A, an alternate embodiment interconnect substrate 16B includes indentation contact members 20B for making electrical connections to a wafer with bumped contact locations 15B. The bumped contact locations 15B will typically be solder bumps bonded to a thin film bond pad. Conventionally formed solder bumps on a bumped die 14B have a diameter of from 1 mils to 60 mils. Accordingly, the indentation contact members 46A can be formed with an inside diameter of from 0.25 to 20 mils.

For testing bumped dice 14B, the interconnect substrate 16B can be formed of either silicon or ceramic. With a silicon substrate an insulating layer 54B as previously described is required. The indentation contact members 20B can be formed by etching or laser ablating concave depressions in the interconnect substrate 16B, and then forming conductive layers 38B on the depressions substantially as previously described for conductive layers 38. The conductive layers 38B for the indentation contact members 20B can be formed in electrical communication with corresponding conductors 52B as previously described.

Figure 4C:
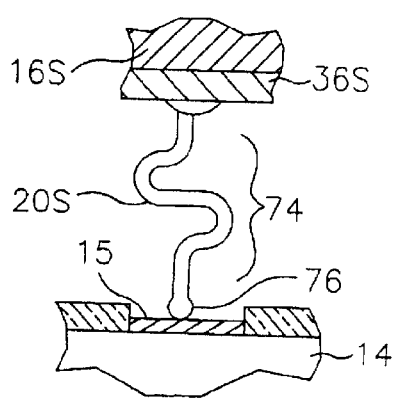
FIG. 4C is an enlarged cross sectional view equivalent to FIG. 4, illustrating another alternate embodiment contact member comprising a compliant spring segment.

As shown in FIG. 4B, the indentation contact member 20B can also include a penetrating projection 48B for penetrating the bumped contact location 15B to a limited penetration depth. In addition, the indentation can be omitted and the penetrating projection 48B can be formed directly on the surface of the interconnect substrate 16B As shown in FIG. 4C, an alternate embodiment interconnect substrate 16S includes compliant contact member 20S for making electrical connections to the contact locations 15 (FIG. 4) previously described. The compliant contact member 20S can comprise a spring segment 74 and a ball contact 76. The spring segment 74 permits the compliant contact member 20S to flex to accommodate variations in the locations of the contact locations 15. The compliant contact members 20S can be attached to conductors 36S formed on the interconnect substrate 16S as previously described for conductor 36 (FIG. 4).

The complaint contact member 20S can be formed by wire bonding or welding a metal wire to the conductor 36S. During the wire bonding or welding process, the wires can be shaped to form the spring segments 74 and ball contacts 76. U.S. Pat. No. 5,495,667, incorporated herein by reference, describes a method for forming the compliant contact members 20S. The spring contact members 20S rather than including spring segments can also be elongated pins that are angled with respect to the substrate 16S to provide flexure or compliancy.

As shown in FIG. 4D, an indentation contact member 20D can also comprise a conductive layer 20D plated directly on an interconnect substrate 16D. In this embodiment the interconnect substrate 16D can be formed of ceramic or other insulating material. In this embodiment depressions can be formed in the interconnect substrate 16D by etching or laser machining.

Figure 5:
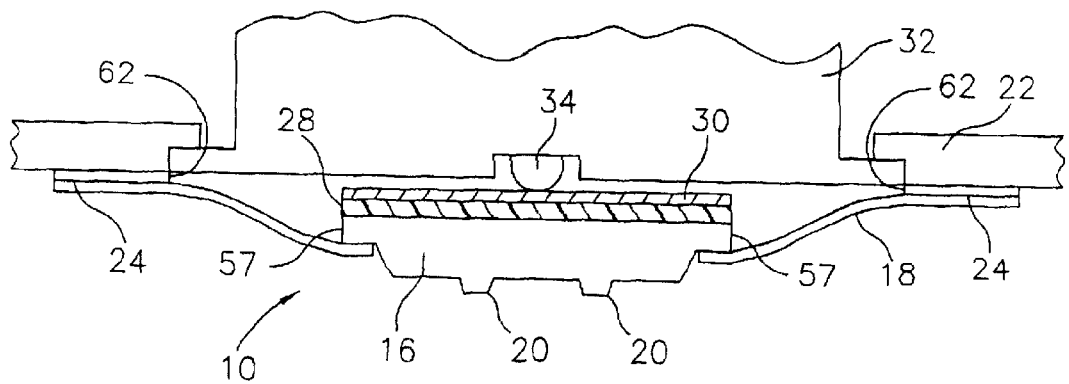
FIG. 5 is a schematic cross sectional view illustrating the connection between the interconnect substrate, the membrane and the probe card fixture.

Referring to FIG. 5, the mounting of the interconnect substrate 16 to the membrane 18 is illustrated. In general, the membrane 18 functions to physically attach the interconnect substrate 16 to the membrane mounting plate 24 and probe card fixture 22. In addition, the membrane 18 functions to provide electrical paths between the contact members 20 and the test circuitry 44 (FIG. 1). The membrane 18 can be formed of thin flexible materials to allow movement of the interconnect substrate 16 in z-directions. Additionally, the membrane 18 can be formed of materials to provide electrical insulation for the electrical paths.

Figure 7A:
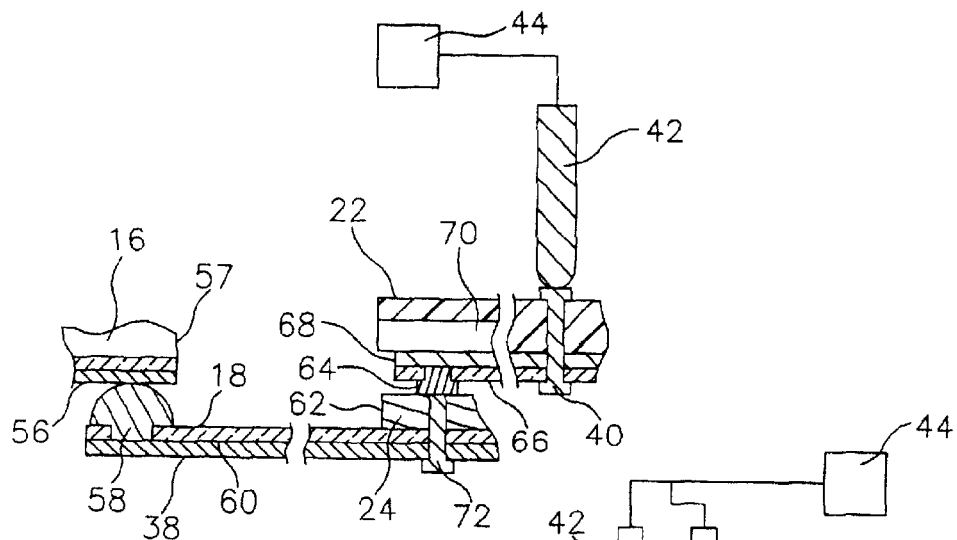
FIG. 7A is a schematic cross sectional view illustrating the electrical path from the interconnect substrate to test circuitry for the probe card shown in FIG. 1.

For example, the membrane 18 can be formed of a flexible multi layered material similar to TAB tape. TAB tape is commercially available from manufacturers such as 3M, Shinko and Packard Hughes. In the illustrative embodiment the membrane 18 comprises a layer of polymer tape 60 (FIG. 7A) formed of polyimide or other elastomeric material. The conductors 38 (FIG. 7A) on the membrane 18 comprise a metal foil, such as copper, patterned as required and laminated to the polymer tape 60 (FIG. 7A). In the embodiment illustrated in FIG. 5, the membrane 18 is bonded directly to the interconnect 16.

In addition, the membrane 18 can be attached to the membrane mounting plate 24, which can be attached to the probe card fixture 22. The membrane 18 can be attached or laminated to the membrane mounting plate 24 using an adhesive. The membrane mounting plate 24 can be formed as an annular shaped member, out of a rigid, electrically insulating, material such as a glass filled plastic (e.g., FR-4). The membrane 18 overhangs from an edge 62 of the membrane mounting plate 24. With this arrangement, the interconnect substrate 16 is suspended from the probe card fixture 22, electrically and physically connected by the membrane 18. A desired amount of flexibility and slack, can be provided in the membrane 18 to allow the interconnect substrate 16 to freely move in the z direction.

Figure 5A:
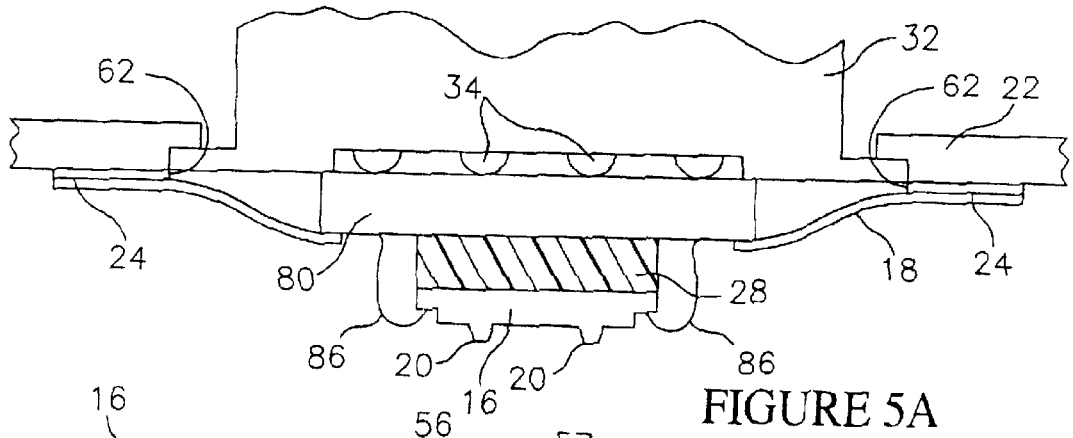
FIG. 5A is a schematic cross sectional view equivalent to FIG. 5 but illustrating an alternate embodiment connection using a rigid mounting plate.

Referring to FIG. 5A, an alternate embodiment mounting arrangement for-the interconnect substrate 16 is illustrated. In the embodiment illustrated in FIG. 5A, the membrane 18 is bonded to a mounting plate 80 and the interconnect substrate 16 is attached to the mounting plate 80. The mounting plate 80 can be formed of an electrically insulating material such as ceramic, or FR-4. In addition the mounting plate 80 can include patterns of conductors (not shown) for electrically connecting to the membrane 18. In the FIG. 5A embodiment, wires 86 can be wire bonded to conductors on the mounting plate 80 and to the bonding pads 56 (FIG. 4) on the interconnect 16 to form electrical paths therebetween.

Figure 6A:
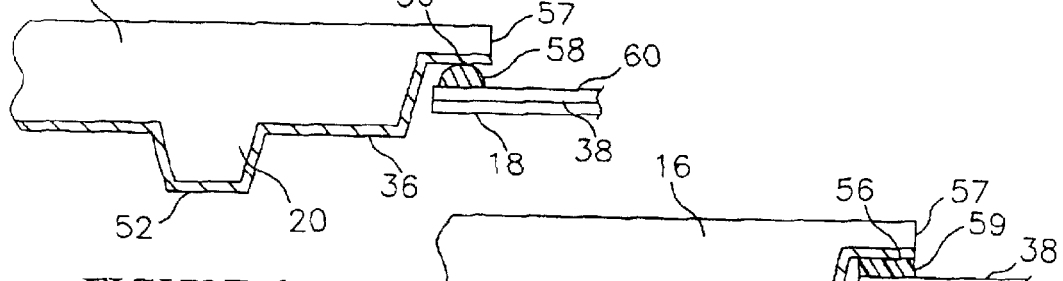
FIGS. 6A–6C are schematic cross sectional views illustrating an edge of the interconnect substrate and different electrical connections to conductors on the interconnect substrate.
Figure 6B:
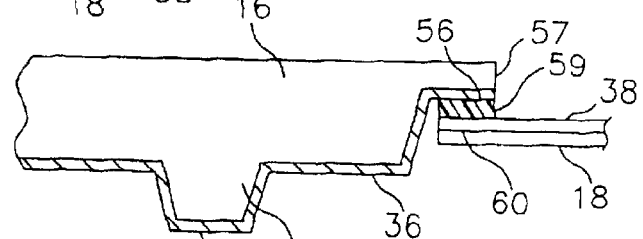
Figure 6C:
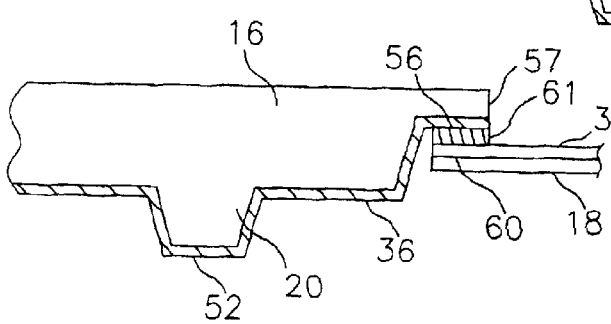

Referring to FIGS. 6A–6C different arrangements for bonding the membrane 18 and the interconnect substrate 16 are illustrated. In FIG. 6A, the conductors 38 on the membrane 18 can include metal microbumps 58 formed in vias through the polymer tape 60 and arranged in a desired pattern. The metal microbumps 58 can be formed of a heat bondable metal such as solder. This permits the metal microbumps 58 to be bonded, using heat or ultrasound, to the bonding pads 56 on the conductors 36 for the interconnect substrate 16 to form an electrical connection therebetween.

Preferably the edge 57 of the interconnect substrate 16 is stepped or grooved so that the contact members 20 can contact the contact locations 15 (FIG. 4) without interference from the metal microbumps 58. As the membrane 18 can have a thickness of several mils or more the stepped edge 57 must recess the membrane from the contact members 20 by at least the same amount. As will be further explained, the stepped edge 57 can be formed by etching the substrate. In addition the conductors 36 for the interconnect substrate 16 can be formed over the stepped edge 57.

In the embodiment illustrated in FIG. 6B, the electrical connection between the interconnect substrate 16 and membrane 18 can be formed by a conductive adhesive 59 such as a z-axis anisotropic adhesive. The conductive adhesive 59 can be deposited and cured to provide electrical communication between the bonding pads 56 on the interconnect substrate 16 and the conductors 38 on the membrane 18.

In the embodiment illustrated in FIG. 6C, the electrical connection between the interconnect substrate 16 and membrane 18 can be formed by a metal bump 61 bonded to the bonding pads 56 and the conductors 38. One suitable metal for forming the metal bump 61 is gold.

Referring to FIG. 7A, an exemplary electrical path from the membrane 18 to the test circuitry 44 is illustrated. The membrane mounting plate 24 can include electrically conductive contact plugs 72 (or vias) in electrical communication with the conductors 38 on the membrane 18. The contact plugs 72 on the membrane mounting plate 24 can be placed in electrical communication with metal microbumps 64 on the probe card fixture 22. The metal microbumps 64 can be formed on conductors 68 of TAB tape 66 attached to the probe card fixture 22. The conductors 68 on the TAB tape 66 can be in electrical connection with the contact plugs 40 on the probe card fixture 22. The contact plugs 40 on the probe card fixture 22 can be configured for electrical contact with pogo pins 42 or other electrical connectors in electrical communication with the test circuitry 44. In addition, the probe card fixture 22 can include an annular recess 70 (FIG. 4) to allow flexure of the TAB tape 66 relative to the probe card fixture 22.

The electrical path to and from the contact locations 15 (FIG. 4) on the dice 14 to the test circuitry 44 (FIG. 7A) is through the conductive layer 52 (FIG. 6A) on the contact members 20, through the conductors 36 (FIG. 6A) on the interconnect substrate 16 (FIG. 6A), through the metal microbumps 58 (FIG. 7A) on the membrane 18, through the conductors 38 (FIG. 7A) on the membrane 18, through the contact plugs 72 (FIG. 7A) on the membrane mounting plate 24, through the microbump 64 (FIG. 7A) on the TAB tape 66 (FIG. 7A), through the conductors 68 (FIG. 7A) on the TAB tape 66 for the membrane mounting plate 24, through the contact plugs 40 (FIG. 7A) on the probe card fixture 22, and through the pogo pins 42 (FIG. 7A). The test circuitry 44 is configured to apply test signals to test the operability of the integrated circuits on the dice 14.

Figure 7B:
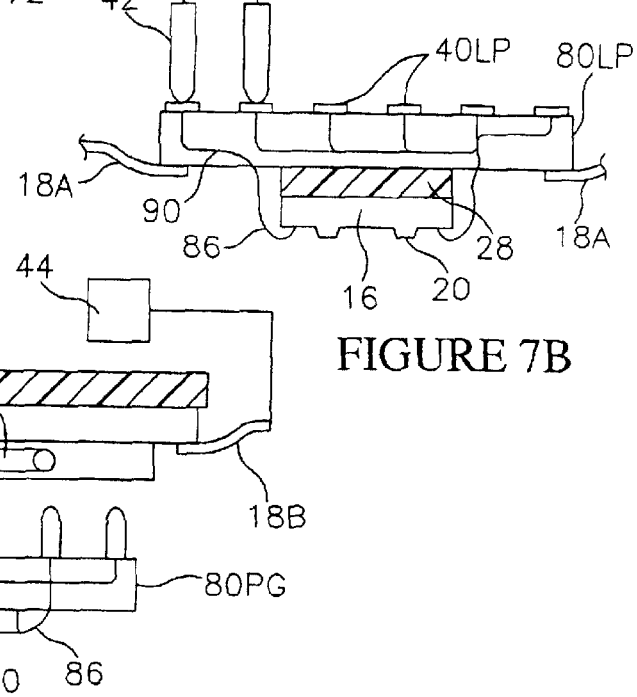
FIG. 7B is a schematic cross sectional view illustrating an alternate mounting arrangement and electrical path to test circuitry for the interconnect substrate.

FIG. 7B illustrates another mounting arrangement and exemplary electrical path to test circuitry 44. In this embodiment the interconnect substrate 16 is mounted to a mounting plate 80LP and compressible member 28 substantially as previously described for mounting plate 80. In addition, a membrane 18A physically mounts the mounting plate 80LP to the probe card fixture 22 (FIG. 1). In this embodiment the mounting plate 80LP can include land pads 40LP arranged in a land grid array (LGA). The land pads 40LP can also include ball contacts (not shown) attached thereto to form a ball grid array (BGA). The land pads 40LP are in electrical communication with internal conductors 90 formed within the mounting plate 80LP. By way of example, the mounting plate 80LP can be formed of laminated ceramic layers and the internal conductors 90 can be embedded in the ceramic layers. The conductors 90 can include bonding pads (not shown) for wire bonding to the bond wires 86. Pogo pins 42 in electrical communication with the test circuitry 44 are adapted to contact the land pads 40LP to form an electrical path for testing. Alternately in this embodiment the compressible member 28 can be eliminated and the interconnect substrate 16 mounted directly to the mounting plate 80LP.

Figure 7C:
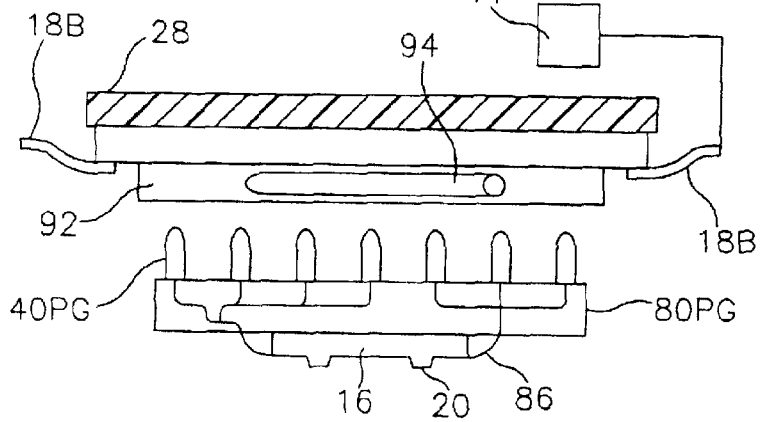
FIG. 7C is a schematic cross sectional view illustrating another alternate embodiment mounting arrangement for the interconnect substrate, including a socket mounted to the probe card fixture and a mounting plate with terminal contacts.

FIG. 7C illustrates a mounting plate 80PG having external contacts comprising pin contacts 40PG arranged in a pin grid array (PGA). In this embodiment, the mounting plate 80PG is adapted to plug into a socket 92 mounted to the probe card fixture 22 (FIG. 1) or other component of the testing apparatus (e.g., wafer probe handler). The socket 92 can be bonded to a membrane 18B in electrical communication with the test circuitry 44 substantially as previously described. In addition, the socket 92 can include a lever 94 for latching the pin contacts 40PG with mating members on the socket 92 using latching mechanisms constructed using techniques that are known in the art. In this embodiment the compressible member 28 can be mounted between the socket 92 and the probe card fixture 22 (FIG. 1). Alternately, rather than forming the pin contacts 40PG in a pin grid array (PGA), the mounting plate 80PG can be formed in other standard semiconductor packaging arrangements such as dual in line package (DIP), zig-zag in line package (ZIP), land grid array (LGA) or ball grid array (BGA). By using standard mounting plates 80PG, the costs associated with forming the interconnect substrate 16 can be reduced. In addition, the socket 92 allows the interconnect substrate 16 to be easily installed and interchanged with other types of interconnect substrates.

Figure 7D:
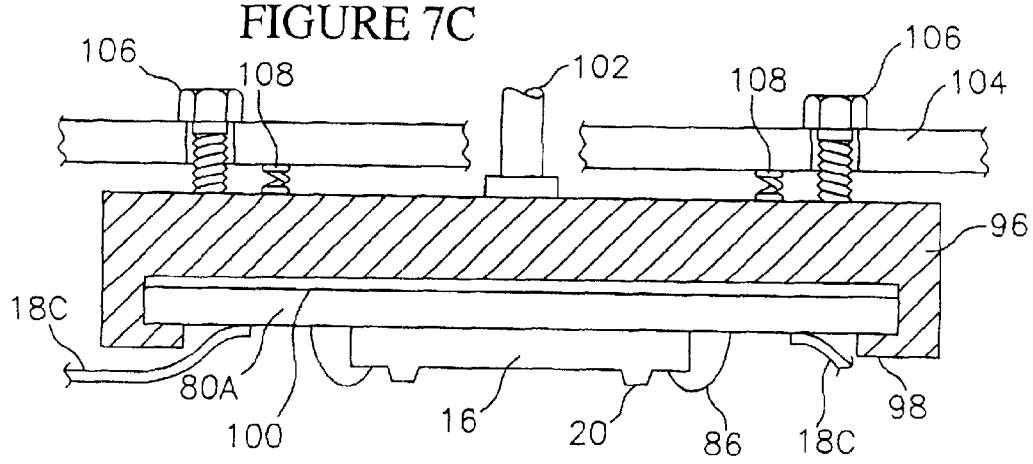
FIG. 7D is a schematic cross sectional view illustrating another alternate embodiment mounting arrangement for the interconnect substrate including a leveling mechanism.

FIG. 7D illustrates a mounting plate 80A for the interconnect substrate 16 that is mounted to an air cushion fixture 96. The air cushion fixture 96 includes a sealed space 100 in flow communication with a gas supply 102 (e.g., compressed air). The air cushion fixture 96 can include a gas conduit or can be formed of a porous material such as ceramic diffusion stone to permit gas flow to the sealed space 100. The interconnect substrate 16 is slidably mounted to the air cushion fixture 96 such that gas pressure in the sealed space 100 provides a desired force for biasing the interconnect substrate 16 against the wafer 12 (FIG. 1). The gas pressure within the sealed space 100 can be controlled to exert a desired biasing force against the interconnect substrate 16. In addition, the gas can be heated or cooled as required to provide a desired temperature for a testing procedure. A stop member 98 can be formed on the air cushion fixture 96 to limit axial movement of the interconnect substrate 16. In this embodiment the electrical connection to the test circuitry 44 can be through a membrane 18C bonded to the mounting plate 80A and test circuitry 44 substantially as previously described. In addition, a leveling mechanism 104 can be mounted to the probe card fixture 22 (FIG. 1) for leveling the air cushion fixture 96 with respect to the wafer 12 (FIG. 1). The leveling mechanism 104 attaches to the probe card fixture 22 substantially as previously described for force applying mechanism 32. The leveling mechanism 104 can include three or more leveling screws 106 and optionally leveling springs 108 for leveling the air cushion fixture 96. The leveling mechanism 104 can also include leveling shims (not shown).

Figure 7E:
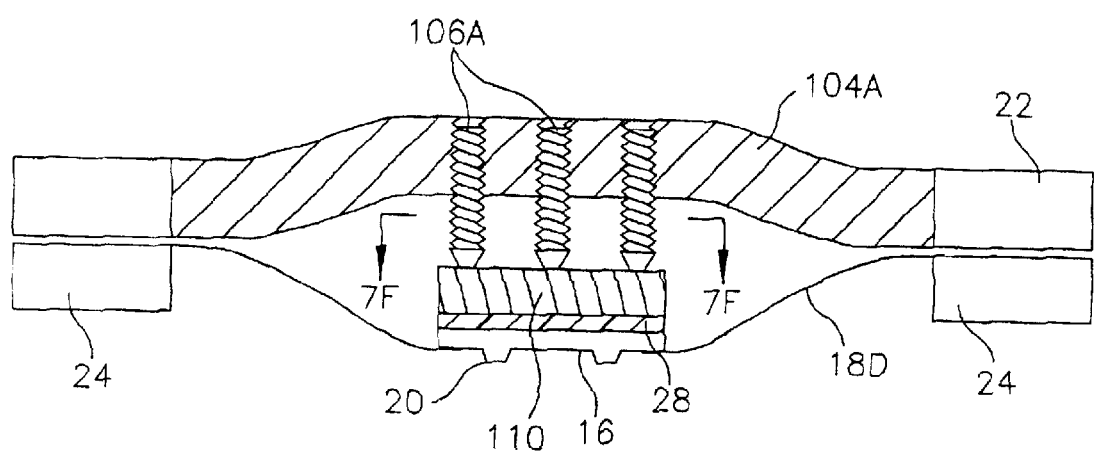
FIG. 7E is a schematic cross sectional view illustrating another alternate embodiment mounting arrangement for the interconnect substrate including a leveling mechanism.
Figure 7F:
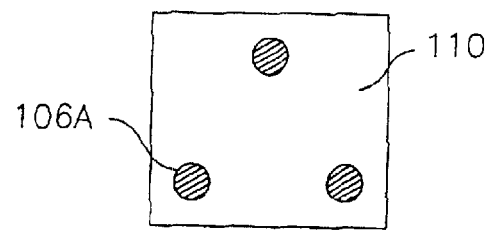
FIG. 7F is a schematic cross sectional view taken along section line 7F—7F of FIG. 7E.

FIGS. 7E and 7F illustrate another leveling mechanism 104A. The leveling mechanism 104A can attaches to probe card fixture 22 substantially as previously described for force applying mechanism 32 (FIG. 1). In addition, a membrane 18D physically and electrically connects the interconnect substrate 16 to test circuitry 44 substantially as previously described. The leveling mechanism 104A includes a leveling plate 110 and leveling screws 106A. As shown in FIG. 7F, three leveling screws 106A are arranged in a triangular pattern and threadably engage mating threaded openings in the leveling mechanism 104A. The leveling screws 106A permit the planarity of the contact members 20 to be adjusted with respect to a plane of the wafer 12 (FIG. 1). This allows the interconnect substrate 16 to be easily installed or replaced as required, without requiring the probe handler chuck to be replanarized. If desired the leveling screws 106A can be pivotably mounted to the leveling mechanism 104A using ball joints (not shown) or similar members.

Figure 8:
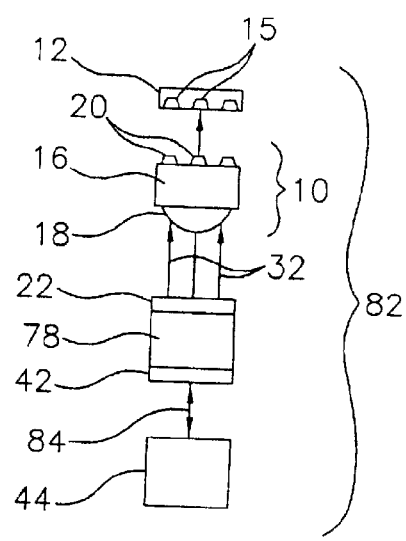
FIG. 8 is a schematic block diagram illustrating a test system having a probe card constructed in accordance with the invention.

Referring to FIG. 8, a system 82 constructed in accordance with the invention is shown. The system 82 includes a testing apparatus 78 in the form of a conventional wafer probe handler or similar apparatus. One suitable wafer probe handler is manufactured by Electroglass and is designated a Model 4080. The testing apparatus 78 is in electrical communication with or includes the test circuitry 44. The test circuitry 44 is adapted to send and receive test signals 84 for testing the integrated circuits on the wafer 12. The testing apparatus 78 can also include an optical or mechanical alignment system for aligning the contact locations 15 (FIG. 4) on the wafer 12 to the contact members 20 on the interconnect substrate 16.

In addition, the testing apparatus 78 can include the pogo pins 42 in the conductive path from the test circuitry 44. The testing apparatus 78 can also include the probe card fixture 22. Still further, the testing apparatus 78 can include the force applying mechanism 32 for applying pressure to bias the interconnect substrate 16 against the wafer 12.

The probe card 10 includes the membrane 18 and the interconnect substrate 16. The membrane 18 can be attached to the probe card fixture 22 as previously described. In addition, the interconnect substrate 16 can be attached to the membrane 18 also as previously described. The contact members 20 on the interconnect substrate are configured to penetrate the contact locations 15, on the wafer 12 to a limited penetration depth.

Figure 9A:
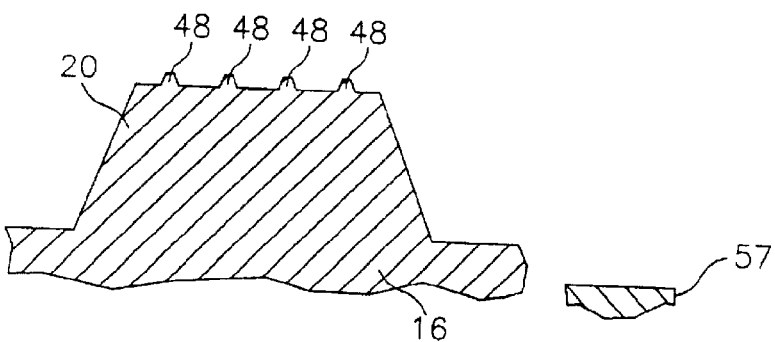
FIGS. 9A–9C are enlarged schematic cross sectional views illustrating a fabrication process for the interconnect substrate shown in FIG. 1.
Figure 9B:
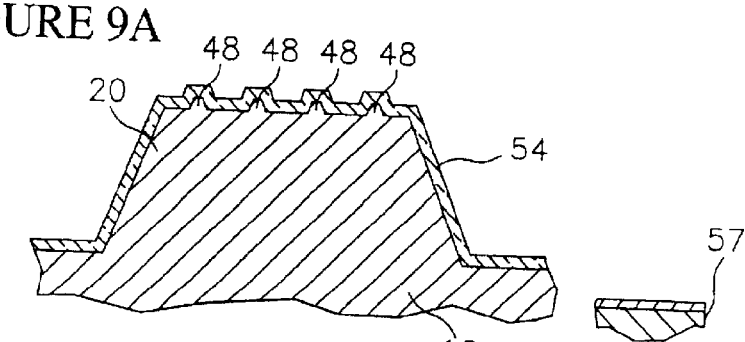
Figure 9C:
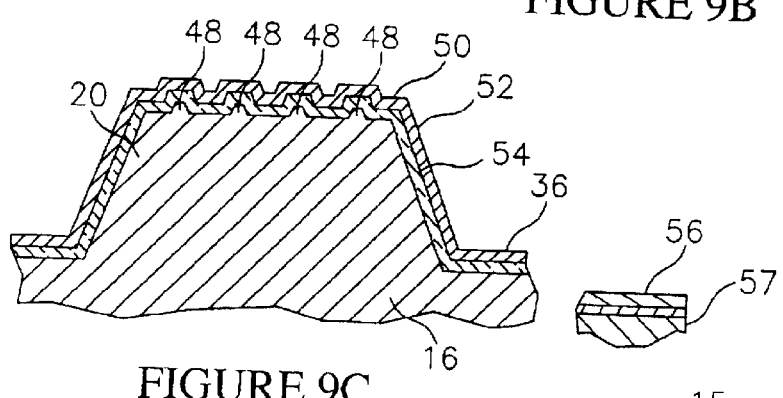

Referring to FIGS. 9A–9C, a method for forming the raised contact members 20 using an etching process is shown. In the process illustrated in FIGS. 9A–9C the interconnect substrate 16 comprises silicon or other etchable semiconductor material.

Initially, as shown in FIG. 9A, the penetrating projections 48 can be formed by forming a mask (not shown) on the substrate 16 and then etching exposed portion of the substrate 16 through the mask. For example, a hard mask can be formed on the substrate 16 by depositing a layer of silicon nitride ($Si_3N_4$) and then patterning the silicon nitride layer using hot phosphoric acid. A wet or dry, isotropic or anisotropic, etch process can then be used to etch through openings in the hard mask to form the projections 48. For example, an anisotropic etch can be performed on a substrate 16 formed of silicon using a solution of KOH and $H_2O$. This type of semiconductor fabrication process is sometimes referred to as "bulk micromachining".

The projections 48 can be elongated blades or sharp points formed in locations that match the placement of the contact locations 15 (FIG. 4) on the dice 14. In the illustrative embodiment, there are four projections 48 per contact member 20. However, a greater or lesser number of projections 48 can be formed. In addition, the projections 48 for each contact member 20 are formed in a pattern having an outline contained within the perimeter of the contact locations 15 (FIG. 4) on the dice 14. A representative height for the projections 48 measured from the base to the tip can be from 0.1 to 1 $\mu$m. A representative length for the projections 48 measured from end to end can be from 3 to 10 $\mu$m. The size of the projections 48 (e.g., 100–10,000 Å) insures that the projections do not penetrate through the contact locations 15 (FIG. 4), which are typically about 2000 to 15,000 Å thick. In addition, surface 50 (FIG. 9C) on the contact members 16 provide a stop plane to limit the penetration depth.

Once the projections 48 are formed, the hard mask can be stripped and another mask (not shown) can be formed for etching the substrate 16 to form the contact members 20. Using an anisotropic etch process, the contact members 20 can be formed as topographically elevated pillars generally conical in shape. A representative height of the contact members 20 from base to tip can be from 10–100 $\mu$m. The contact members 20 thus have a height that is from 10 to 1000 times greater than the height of the penetrating projections 48.

A representative width of each side of the contact members 20 can be from 40–80 $\mu$m. In use the contact members 20 separate the interconnect substrate 16 from the wafer 12 with a clearance distance equal to the height of the contact members 20 (e.g., 10–100 $\mu$m). This separation distance functions to clear particulate contaminants on the opposing surfaces that could cause shorting. The separation distance also functions to diminish cross talk between the wafer 12 and the interconnect substrate 16 during the test procedure. Following formation of the contact members 20, the etch mask can be stripped.

Suitable etch processes for forming the contact members 20 and projections 16 substantially as shown in FIG. 9A are also disclosed in U.S. Pat. Nos. 5,326,428; 5,419,807 and 5,483,741 which are incorporated herein by reference.

In addition to etching the penetrating projections 48 and contact members 20 the peripheral edges of the interconnect substrate 16 can be etched to form the stepped edge 57. The stepped edge 57 forms a shelf wherein the bonding pads 56 will be formed. The shelf helps to provide a clearance space for bonding the membrane 18 to the interconnect substrate 16.

Referring to FIG. 9B, once the projections 16 and contact members 20 have been formed, the insulating layer 54 can be formed over the entire interconnect substrate 16 including over the contact members 20 and projections 48. The insulating layer 54 can be a grown or deposited material such as $SiO_2$ or $Si_3N_4$. A representative thickness for the insulating layer 54 can be from 500 Å to 1 $\mu$m.

Following formation of the insulating layer 54 and as shown in FIG. 9C, the conductive layers 52 for the contact members 20 can be formed on the insulating layer 54. The conductive layers 52 for all of the contact members 20 can be a same layer of material that has been patterned to cover just the contact members 20 and selected portions of the substrate 16. To form the conductive layers 52, a highly conductive metal can be blanket deposited on the substrate 16 by sputtering or other deposition process. Exemplary metals include aluminum, platinum, palladium, copper, gold and silver or alloys of these metals. A representative thickness for the conductive layers 52 can be from 500 Å to 2 μm. Some of these metals particularly gold and platinum are non-reactive such that material transfer between the conductive layers 52 and contact locations 15 (FIG. 4) can be minimized. The conductive layers 52 can also comprise a bi-metal stack comprising a base layer and a non-reactive outer layer.

Following blanket deposition of the desired conductive metal, a resist mask can be formed and used for etching the conductive metal such that at least a portion of the contact members 20 remain covered with the conductive layers 52. The resist mask can be deposited using a standard photoresist deposition and exposure process. This can include spin deposition, followed by hardening, exposure and development. U.S. patent application Ser. No. 08/520,871, now U.S. Pat. No. 5,607,818, incorporated herein by reference describes a method for patterning a conductive layer using an electrophoretically deposited layer of resist.

As an alternative to a metallization process (i.e., deposition resist, mask formation, etching), the conductive layers 52 can be formed as a metal silicide using a process as disclosed in U.S. Pat. No. 5,483,741 incorporated herein by reference.

During formation of the conductive layers 52, the conductors 36 and bonding pads 56 can also be formed in electrical communication with the conductive layers 52 using the same material and metallization process used to form the conductive layers 52. As the bonding pads 56 are located along the stepped edge 57 of the interconnect substrate 16, the conductors 36 can follow the contour of the stepped edge 57. The conductors 36 and bonding pads 56 can also be formed using different materials and different metallization processes. For example, the conductors 36 and bonding pads 56 can be formed using a process such as plating, thin film deposition or screen printing. In addition, the conductors 36 can be insulated with a layer of material such as polyimide (not shown).

Thus the invention provides an improved probe card for testing semiconductors wafers, a method for testing semiconductor wafers using the probe card, and a system for testing using the probe card. The probe card can include contact members formed on a silicon interconnect such that a CTE with the wafer is matched. In addition, contact members can be formed on the interconnect in dense arrays to accommodate testing of dense arrays of dice having dense contact locations. Another advantage is that the contact members can be used to repeatedly test wafers without requiring adjustment for damage or wear as with conventional probe cards. Still further, because the contact members can be made very small, the size of the contact locations on the wafer can also be made very small. This can allow the size of the dice on the wafer to be smaller.

While the invention has been described with reference to certain preferred embodiments, as will be apparent to those skilled in the art, certain changes and modifications can be made without departing from the scope of the invention as defined by the following claims.

What is claimed is:

1. A method for testing a semiconductor wafer comprising:

providing a testing apparatus comprising a test circuitry configured to apply test signals to the wafer, a suspended plate, a substrate on the suspended plate, and a force applying mechanism comprising a plurality of electrical connectors in contact with the suspended plate in electrical communication with the test circuitry;

biasing the substrate against the wafer using the suspended plate and the force applying mechanism; and applying the test signals through the electrical connectors, through the suspended plate and through the substrate to the wafer.

2. The method of claim 1 wherein a membrane mounts the suspended plate on the testing apparatus.

3. The method of claim 1 further comprising providing a compressible member between the suspended plate and the substrate.

4. The method of claim 1 wherein the substrate includes a plurality of contact members configured to electrically contact a plurality of contact locations on the wafer.

5. The method of claim 4 wherein each contact member comprises an indentation in the substrate or a projection on the substrate.

6. The method of claim 1 wherein the testing apparatus comprises a wafer prober.

7. In a test system including a testing apparatus for a semiconductor wafer, a method for testing the wafer comprising:

suspending a substrate on the testing apparatus;

providing a force applying mechanism on the testing apparatus comprising a plurality of electrical connectors configured to bias the substrate against the wafer;

biasing the substrate against the wafer using the force applying mechanism; and applying test signals through the electrical connectors and the substrate to the wafer.

8. The method of claim 7 wherein the suspending step is performed by connecting a membrane to a plate attached to the substrate.

9. The method of claim 8 wherein each electrical connector comprises a pin.

10. The method of claim 9 wherein the substrate comprises a plurality of contact members configured to electrically engage contact locations on the wafer.

11. The method of claim 10 wherein the contact locations comprise bumps and the contact members comprise indentations and conductive layers on the indentations.

12. The method of claim 10 wherein the contact locations comprise pads and the contact members comprise projections configured to penetrate the pads.

* * * * *